United States Patent
Poinelli et al.

(10) Patent No.: US 6,592,352 B1
(45) Date of Patent: Jul. 15, 2003

(54) OFFSET EDGES MOLD FOR PLASTIC PACKAGING OF INTEGRATED SEMICONDUCTOR DEVICES

(75) Inventors: Renato Poinelli, Casatenovo (IT); Mauro Mazzola, Calvenzano (IT); Roberto Brioschi, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 238 days.

(21) Appl. No.: 09/630,499

(22) Filed: Aug. 2, 2000

(30) Foreign Application Priority Data

Aug. 4, 1999 (EP) .............................................. 99830508

(51) Int. Cl.[7] ........................ B29C 45/14; B29C 70/72; H01L 21/56
(52) U.S. Cl. ................ 425/116; 264/272.17; 264/328.9; 264/328.12; 425/129.1; 425/544
(58) Field of Search .............................. 425/116, 129.1, 425/544; 264/272.17, 328.12, 328.9

(56) References Cited

U.S. PATENT DOCUMENTS

| | | | |
|---|---|---|---|
| 4,556,896 A | * 12/1985 | Meddles | 257/667 |
| 5,197,183 A | 3/1993 | Chia et al. | 29/827 |
| 5,275,546 A | * 1/1994 | Fierkens | 425/116 |
| 5,371,044 A | * 12/1994 | Yoshida et al. | 264/272.17 |
| 5,427,938 A | * 6/1995 | Matsumura et al. | 264/272.17 |
| 5,635,220 A | * 6/1997 | Izumi et al. | 425/116 |
| 5,728,600 A | * 3/1998 | Saxelby et al. | 264/272.11 |
| 5,793,613 A | * 8/1998 | Poinelli et al. | 361/723 |
| 5,811,132 A | * 9/1998 | Rho et al. | 425/116 |
| 6,329,705 B1 | * 12/2001 | Ahmad | 257/666 |
| 2002/0050630 A1 | * 5/2002 | Tiziani et al. | 257/666 |

FOREIGN PATENT DOCUMENTS

| | | | |
|---|---|---|---|
| EP | 469 299 | 2/1992 | H01L/21/56 |
| EP | 589 569 | 3/1994 | H01L/21/56 |
| EP | 782 184 | 7/1997 | H01L/21/56 |
| JP | 63-169054 A | * 7/1988 | H01L/21/56 |
| WO | 92/21149 | 11/1992 | H01L/21/56 |

OTHER PUBLICATIONS

Patent Abstract of Japan. Publication No. 01138724 "Molding of Semiconductor Device and Apparatus Therefor" May 31, 1989.
Patent Abstract of Japan. Publication No. 01268159 "Resin–Sealed Semiconductor Device and Injection Metal Mold" Oct. 25, 1989.
Patent Abstract of Japan. Publication No. 06302745 "Resin–Sealed Structure for Semiconductor Chip" Oct. 28, 1994.

* cited by examiner

*Primary Examiner*—Robert Davis
(74) *Attorney, Agent, or Firm*—Lisa K. Jorgenson; Allen, Dyer, Doppelt, Milbrath & Gilchrist, P.A.

(57) ABSTRACT

A mold for packaging an integrated semiconductor device includes two half shells closing on a perimeter dam bar of a die-stamped assembly metal frame of a semiconductor die that is between the two half shells of the mold. A depressed central pad of the metal frame defines, at least along an injection zone of the resin, a slit between the perimeter portion of the metal frame and the central pad. Resin flows through an inlet channel of the mold and through the slit to fill the upper and lower cavities. An edge of the central pad defining the slit is bent upward to form a spoiler intercepting the resin stream so that part of the resin is directed toward the lower cavity. The inner edge of the upper half shell of the mold defining the internal cavity along the injection side of the resin is inwardly offset.

19 Claims, 3 Drawing Sheets

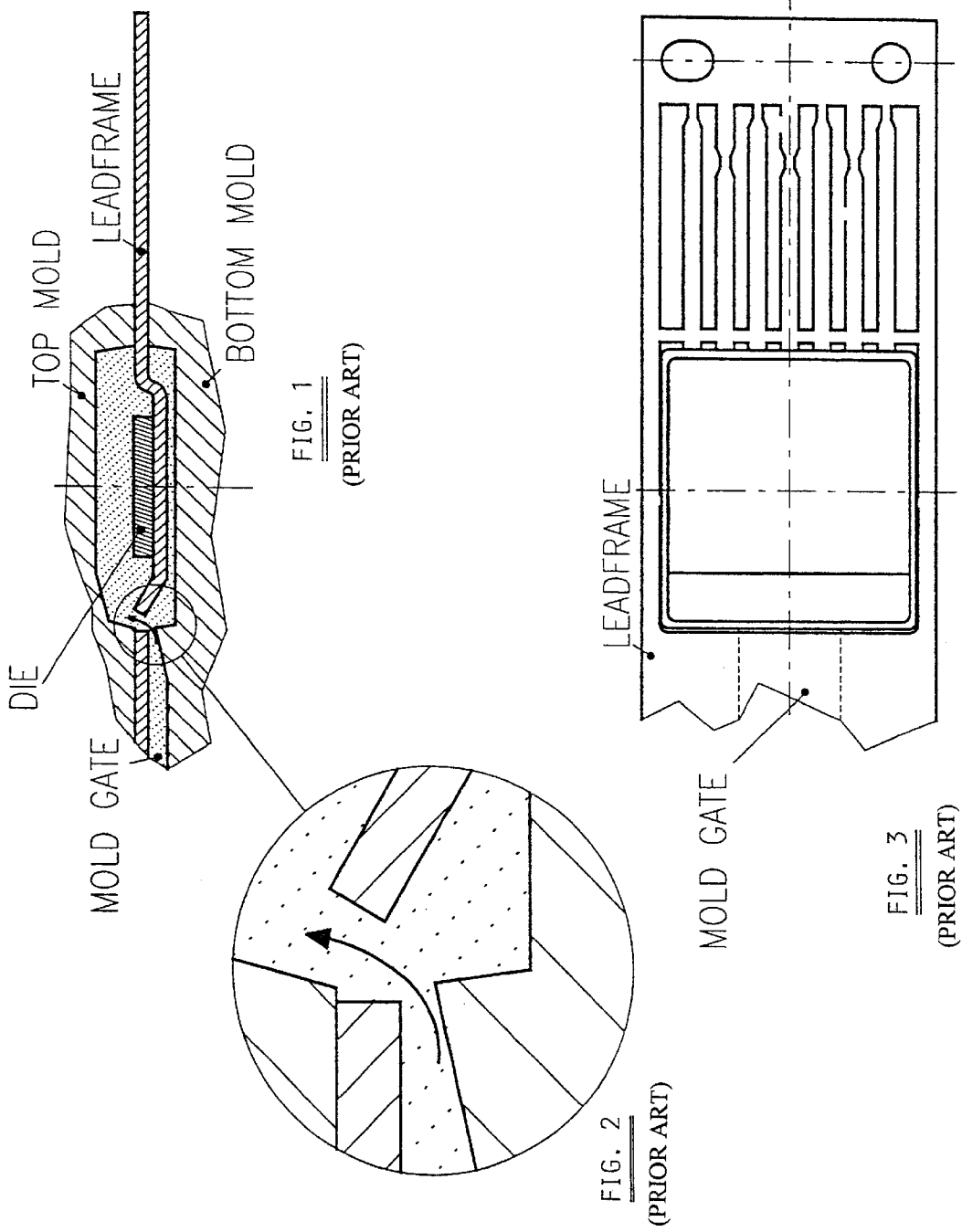

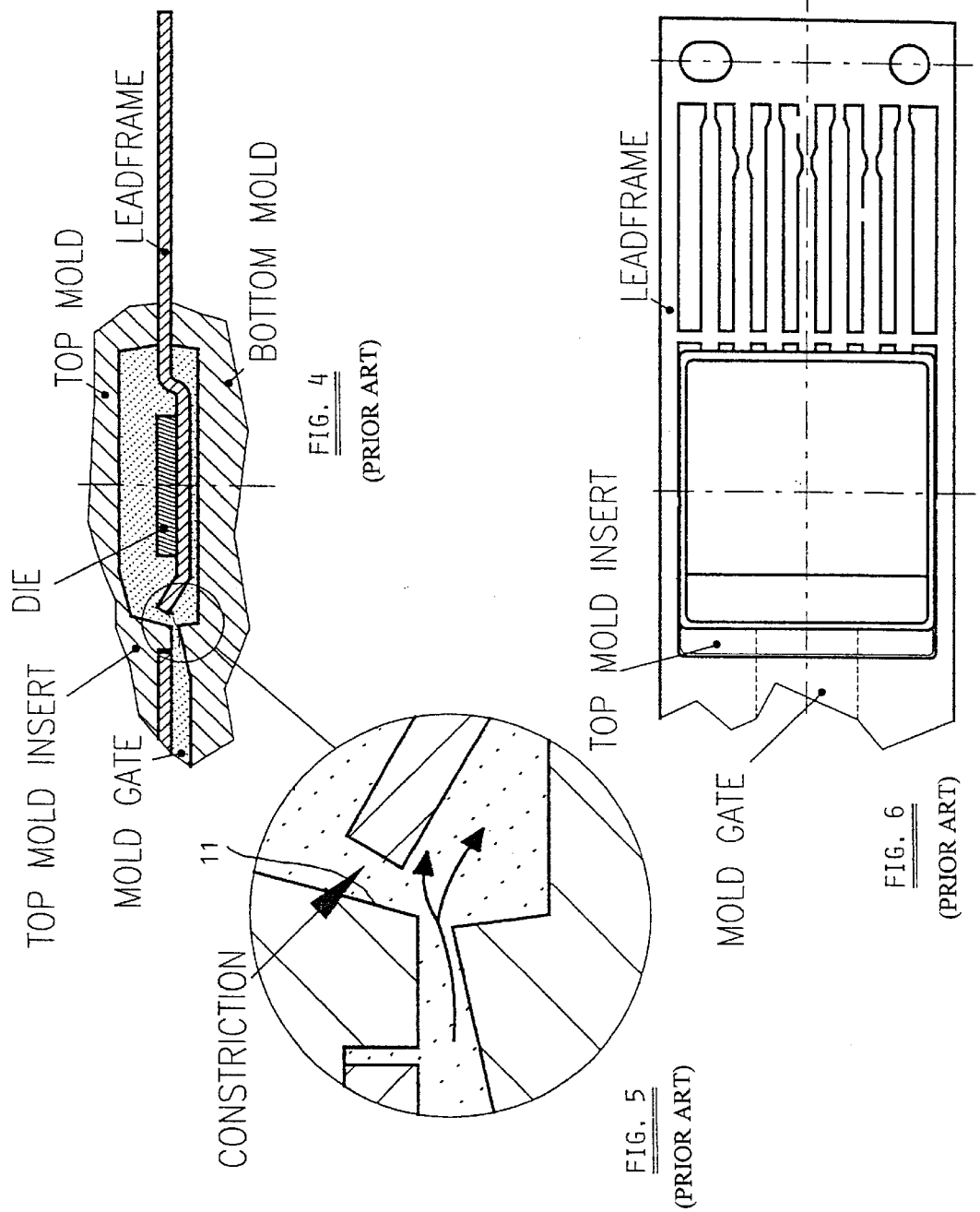

OFFSET EDGES MOLD FOR PLASTIC PACKAGING OF INTEGRATED SEMICONDUCTOR DEVICES

FIELD OF THE INVENTION

The present invention relates to integrated devices, and, more particularly, to a technique for packaging a semiconductor chip or die.

BACKGROUND OF THE INVENTION

Miniaturization compels a generalized reduction in the dimensions of integrated devices. These devices are commonly packaged in an encapsulating resin using injection molding during which the two halves of the mold close on the dam bar of the assembling metal frame of the semiconductor chip or die.

According to consolidated assembling techniques, the die is bonded onto a lowered central isle of the die-stamped metal frame so that the upper surface of the die is coplanar to the peripheral portion of the frame where a plurality of leads are patterned by the die-stamping operation. The wires for connecting the metal pads defined on the upper side of the die to the respective leads of the metal frame are then connected by conventional thermosonic techniques. Once the assembling process is completed, the frame carrying the die is placed between the two halves of the mold, and resin is injected into the mold cavity through an inlet channel defined along one side of the mold.

With respect to the inlet channel that directs the resin into the cavity of the mold, the metal frame has a slit. This split is typically between a raised edge of the depressed central isle of the frame onto which the top side of the semiconductor die is bonded, and a dam bar of the patterned metal frame onto which the two halves of the mold close. The resin is injected through an inlet mouth defined in the lower half shell of the mold and flows through the slit. The resin also fills the upper cavity of the mold, thus encapsulating the die and the connecting wires.

Because the gap between the bottom of the depressed central isle of the metal frame and the lower half of the mold is relatively small, the resin injected into the mold preferentially tends to fill the space defined in the upper portion of the mold cavity, which is relatively larger. This may cause an incomplete or partial filling of the restricted space underneath the depressed central pad or isle of the metal frame.

This problem may be overcome by bending upward the edge of the central pad of the metal frame which defines the passage through which the plastic resin flows toward the upper portion of the cavity of the mold. This forms a "spoiler" baffle that intercepts and directs part of the fluid resin toward the bottom part of the mold. This promotes the complete filling of the lower restricted space of the mold, i.e., underneath the depressed central pad of the metal frame that supports the semiconductor die. The geometric arrangement of having the upper surface of the semiconductor die coplanar with the peripheral portion of the metal frame is essential to facilitate soldering of the connecting wires.

As dimensions are scaled down, this arrangement becomes insufficient to ensure the complete filling of the increasingly restricted space underneath the depressed central pad of the metal frame that supports the semiconductor die, as graphically shown in FIGS. 1, 2 and 3. Therefore, the upper half shell of the mold may be equipped with a special insert or protrusion in the inlet for directing the resin. The protrusion is shaped to partially restrict an opening of the slit through which the resin flows toward the upper cavity of the mold. This protruding insert reduces the width of the slit through which the resin flows. This known approach is shown in FIGS. 4, 5 and 6.

However, this approach has drawbacks for promoting a complete filling of the mold cavity. The mold no longer closes entirely on an uninterrupted dam bar of the stamped metal frame, but along the side of the mold where the resin enters into the mold. The closure takes place by a direct abutment of the two halves of the mold.

Despite the mechanical precision of the molds, it is almost inevitable resin flashes occur due to an imperfect sealing of the mold. This problem is accentuated by the unavoidable inconstancy of the thickness of the stamped metal frames. The presence of resin flashes due to an imperfect sealing and their breaking off that is likely to occur during the successive finishing steps of the packaging process releases particles of resin. These particles of resin accumulate in delicate automation mechanisms, thus leading to their malfunctioning.

Moreover, the criticality of the design and in the machining of such molds, along with their overall relatively high cost, is easily recognized.

SUMMARY OF THE INVENTION

The above noted drawbacks and difficulties are effectively overcome by the present invention, which reduces the width of the resin flow slit that is defined with respect to the inlet zone of the resin. The width is reduced by displacing inward by an adequate distance the edge of the upper half shell of the mold, and along the side of the injection of the resin with respect to the edge of the opposite side of the lower half shell of the mold. This creates a misalignment or mismatch of the two halves of the mold, which essentially defines one side of the packaging resin body of the device.

The inner edge of the upper half of the mold reaches a more inward position than the inner edge of the cooperating opposite side of the lower half of the mold. The result is to efficiently restrict the width of the slit through which the fluid resin flows toward the upper part of the cavity of the mold while maintaining the perimeter sealing of the mold uninterruptingly over the dam bar of the die-stamped assembly metal frame.

The mold according to the present invention has proven itself effective in preventing the occurrence of resin flashes as well as in ensuring a complete filling of all the empty spaces of the cavity of the mold. In particular, the narrow space underneath the depressed central pad of the assembly metal frame is completely filled.

BRIEF DESCRIPTION OF THE DRAWINGS

The different aspects and advantages of the invention will become even clearer through the following description and by referring to the attached drawings, wherein:

FIGS. 1, 2 and 3 are respectively a section view, an enlarged detail view, and a plan view of a mold used for plastic packaging of a semiconductor device according to the prior art;

FIGS. 4, 5 and 6 are respectively a section view, an enlarged detail view, and a plan view of a mold used for plastic packaging of a semiconductor device according to the prior art by showing the preferred direction of flow of the resin toward the upper cavity of the mold.

DETAILED DESCRIPTION OF THE PREFERRED EMBODIMENTS

Figure 7:
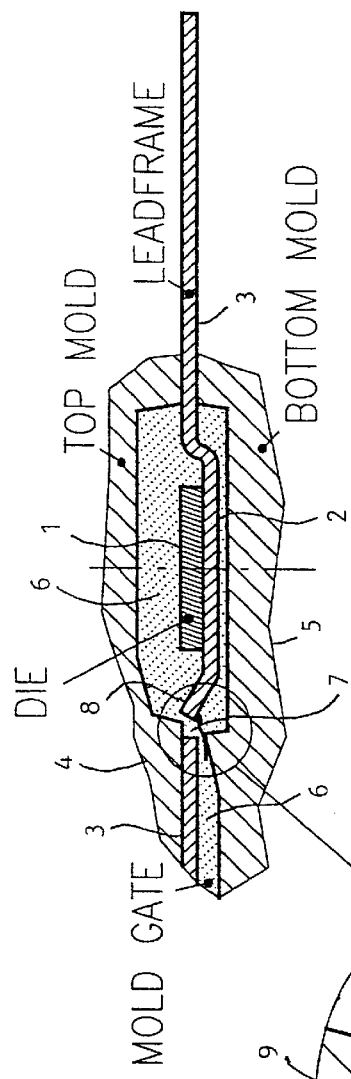
FIGS. 7, 8 and 9 are respectively a section view, an enlarged detail view, and a plan view of a mold used for the plastic packaging of a semiconductor device according to the present invention.
Figure 8:
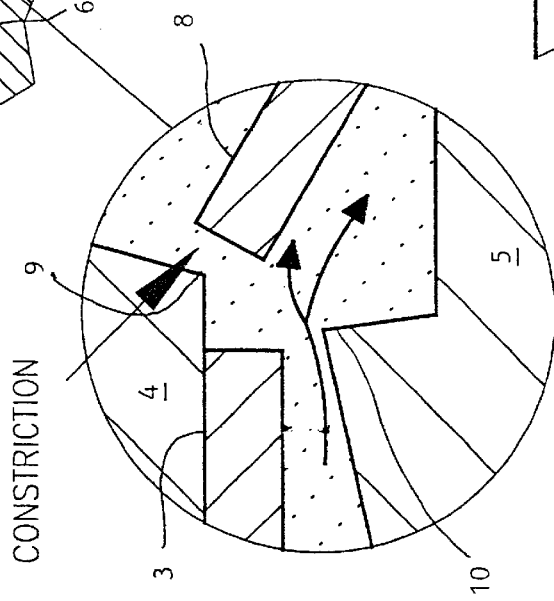
Figure 9:
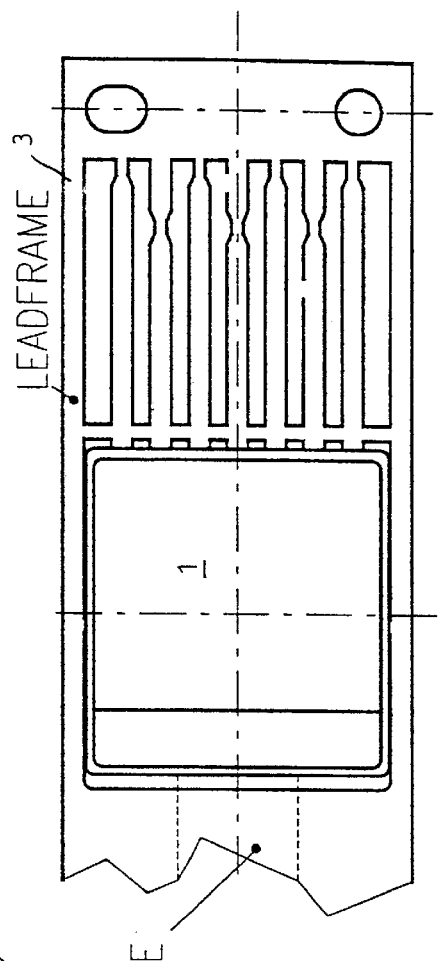

Referring to FIGS. 7, 8 and 9, a semiconductor die 1 is within a closed mold. The die 1 has been assembled onto the depressed central pad 2 of the metal frame 3, and connecting wires (not shown) have been soldered to the surface of the metal pads of the die 1 and to the respective metal leads defined in the die-stamped frame 3. The upper half shell 4 and the lower half shell 5 of the mold define a cavity 6 whose dimensions are adequate to accommodate the die 1, the inner parts of the metal frame 3, and the connecting wires to be packaged in a body of encapsulating resin.

According to a common conformation of the metal frame 3 along the side of a cavity defined by the mold in which an inlet channel 6 for injecting the resin in the cavity of the mold is formed (typically in the lower half shell 5 of the mold), there is a passage or slit 7 between the metal body of the depressed central pad 2 of the frame and the adjacent perimeter area of the metal frame 3. The slit 7 causes the resin to flow upward to fill the upper cavity of the mold encapsulating the die 1, and the connecting wires to the leads of the assembly frame 3.

Conventionally, the edge 8 of the central pad of the metal frame 2 cooperates in defining the flow passage or slit 7 of the resin. The edge 8 is bent upward to form a deflector or spoiler for intercepting the stream of resin and directing part of it to flow downward beneath the central pad 2 of the frame to fill completely the restricted space between the bottom of the depressed central pad of the metal frame and the lower half shell of the mold.

According to the present invention, the width of the slit 7 through which the resin flows toward the upper part of the mold is reduced to form a preferred direction flow of the resin toward the larger upper cavity by advancing the inner edge 9 of the upper half shell 4 of the mold along the side of the inlet channel. This is with respect to the corresponding inner edge 10 of the lower half shell 5 of the mold.

In other words, the inner edges of the two opposite sides of the two halves of the mold are offset. The edge of the upper half of the mold 4 reaches a position that is more advanced inward than the edge of the lower half 5 of the mold. Such a discontinuity remains evident on the body of resin of the resulting package without any undesired effect.

The molds made according to prior techniques, as depicted in FIGS. 4, 5 and 6 use a special protrusion or tooth 11 for determining the required reduction of the width of the flow passage 7 through which the resin flows toward the upper part of the mold cavity 4. The protrusion 11 cooperates in sealing the mold around the injection channel 6 of the resin by abutting against cooperating surfaces of the lower half shell of the mold.

As depicted by the mold structure of FIGS. 7, 8 and 9, the sealing of the mold occurs entirely over the conventionally dedicated uninterrupted perimeter dam bar of the die-stamped metal frame 3. This is different from what occurs in molds made according to prior techniques.

The mold material, the type and the flow characteristics of the encapsulating resin, as well as the materials that form the assembly metal frame, may be the same that are commonly used in the industry. Although the illustrated example refers to a single in-line package, it is evident that conformation of the peculiar offset edges of the two half cells of the mold along the side where the resin is injected and the relative slit 7 of the metal frame may be advantageously used in numerous other types of molds. That is, the mold is not restricted to single in-line packages.

The edge that defines the cavity of the upper half shell of the mold along the entire side or along a part of it where the resin is injected is offset inwardly by a fraction of the width of the slit defined in the assembly metal frame through which the resin is injected. The resin is injected through the inlet channel defined in the lower half shell of the mold so that resin may flow and fill the upper space of the cavity of the mold.

In the illustrated example, the equivalent or effective width of the slit patterned and formed by bending in the metal frame was 0.75 mm. The restriction created by advancing the edge of the upper half shell of the mold accounted to 53% of the width of the slit, i.e., about 0.40 mm. Generally, and depending on the specific flow and geometric parameters of the resin, the inward offset of the edge of the upper half of the mold with respect to the opposite edge of the lower half of the mold may range between 20% and 70% of the width of the slit defined in the metal frame.

That which is claimed is:

1. A mold for encapsulating an integrated semiconductor device comprising a patterned leadframe including a dam bar, a central pad depressed with respect to a planar surface of the dam bar for supporting a die, and an edge of the central pad defining a slit between the dam bar and the central pad being bent upwards forming a deflector, the mold comprising:

a bottom shell closing on a bottom side of the dam bar and defining a lower cavity between bottom shell and the central pad, the bottom shell including an inlet channel through which resin flows to the slit so that the deflector directs part of the resin to fill the lower cavity; and a top shell closing on a top side of the dam bar and defining an upper cavity between the top shell and die, the upper shell includes an inner edge inwardly offset with respect to an opposite inner edge of the lower shell for defining an internal cavity along the inlet channel and for cooperating with the deflector to restrict a width of the slit.

2. A mold according to claim 1, wherein the inner edge of the upper shell is inwardly offset in a range of about 20% to 70% of the width of the slit.

3. A mold according to claim 1, wherein the upper cavity is significantly larger than the lower cavity.

4. A mold according to claim 1, wherein the width of the slit is less than about 0.75 mm.

5. A mold according to claim 1, wherein the integrated semiconductor device comprises single in-line pins.

6. A mold according to claim 1, wherein the die further includes connecting wires between the die and the leadframe; and wherein dimensions of the upper cavity accommodate the connecting wires.

7. A mold for encapsulating an integrated semiconductor device comprising a patterned leadframe including a perimeter portion, a central pad depressed with respect to a planar surface of the perimeter portion for supporting a die, and an edge of the central pad defining a slit between the perimeter portion and the central pad is bent upwards forming a deflector, the mold comprising:

a bottom shell closing on a bottom side of the perimeter portion and defining a lower cavity, the bottom shell including an inlet channel through which resin flows to the slit so that the deflector directs part of the resin to fill the lower cavity; and a top shell closing on a top side of the perimeter portion and defining an upper cavity, the upper shell includes an inner edge inwardly offset with respect to an opposite inner edge of the lower shell for defining an internal cavity along the inlet channel and for cooperating with the deflector to restrict a width of the slit.

8. A mold according to claim 7, wherein the perimeter portion of the leadframe comprises a dam bar.

9. A mold according to claim 7, wherein the inner edge of the upper shell is inwardly offset in a range of about 20% to 70% of the width of the slit.

10. A mold according to claim 7, wherein the upper cavity is significantly larger than the lower cavity.

11. A mold according to claim 7, wherein the width of the slit is less than about 0.75 mm.

12. A mold according to claim 7, wherein the integrated semiconductor device comprises single in-line pins.

13. A mold according to claim 7, wherein the die further includes connecting wires between the die and the leadframe; and wherein dimensions of the upper cavity accommodate the connecting wires.

14. A mold for encapsulating an integrated semiconductor device comprising a patterned leadframe including a perimeter portion, a central pad for supporting a die, and an edge of the central pad defining a slit between the perimeter portion and the central pad is bent upwards forming a deflector, the mold comprising:

a bottom shell closing on a bottom side of the perimeter portion and defining a lower cavity, the bottom shell including an inlet channel through which resin flows to the slit so that the deflector directs part of the resin to fill the lower cavity; and a top shell closing on a top side of the perimeter portion and defining an upper cavity, the upper shell includes an inner edge inwardly offset with respect to an opposite inner edge of the lower shell for defining an internal cavity along the inlet channel and for cooperating with the deflector to restrict a width of the slit, the inner edge being inwardly offset in a range of about 20% to 70% of the width of the slit.

15. A mold according to claim 14, wherein the perimeter portion of the leadframe comprises a dam bar.

16. A mold according to claim 14, wherein the upper cavity is significantly larger than the lower cavity.

17. A mold according to claim 14, wherein the width of the slit is less than about 0.75 mm.

18. A mold according to claim 14, wherein the integrated semiconductor device comprises single in-line pins.

19. A mold according to claim 14, wherein the die further includes connecting wires between the die and the leadframe; and wherein dimensions of the upper cavity accommodate the connecting wires.

* * * * *